(12) United States Patent
Park

(10) Patent No.: US 8,189,392 B2
(45) Date of Patent: May 29, 2012

(54) PAGE BUFFER CIRCUIT

(75) Inventor: Young Soo Park, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 332 days.

(21) Appl. No.: 12/647,609

(22) Filed: Dec. 28, 2009

(65) Prior Publication Data

US 2010/0195402 A1    Aug. 5, 2010

(30) Foreign Application Priority Data

Feb. 2, 2009    (KR) .......................... 10-2009-0008057

(51) Int. Cl.
*G11C 16/06* (2006.01)

(52) U.S. Cl. .............. 365/185.21; 365/207; 365/185.12; 365/189.05

(58) Field of Classification Search ............. 365/185.21, 365/207, 185.12, 189.05, 189.17
See application file for complete search history.

(56) References Cited

U.S. PATENT DOCUMENTS 7,577,029 B2 *   8/2009   Pyeon ...................... 365/185.03

FOREIGN PATENT DOCUMENTS

| KR | 100521318 | 12/2005 |
|----|-----------|---------|
| KR | 1020090000375 | 1/2009 |

OTHER PUBLICATIONS

Notice of Preliminary Rejection issued from Korean Intellectual Property Office on Aug. 23, 2010.

* cited by examiner

*Primary Examiner* — David Lam
(74) *Attorney, Agent, or Firm* — IP & T Group LLP

(57) ABSTRACT

A page buffer circuit comprises a first sensing unit configured to sense a voltage of a bit line and change a voltage of a first sense node, a data conversion unit configured to sense a voltage level of the first sense node and change a voltage level of a second sense node or to couple the second sense node and the first sense node, and first and second latch units coupled in common to the second sense node.

14 Claims, 5 Drawing Sheets

PAGE BUFFER CIRCUIT

CROSS-REFERENCE TO RELATED APPLICATION

Priority to Korean patent application number 10-2009-0008057 filed on Feb. 2, 2009, the entire disclosure of which is incorporated by reference herein, is claimed.

BACKGROUND

Exemplary embodiments relate to a page buffer circuit and, more particularly, to a page buffer circuit having a reduced area by reducing the number of elements.

Semiconductor memory devices may be configured to store data and allow stored data to be read therefrom. Typical examples of semiconductor memory devices are volatile memory devices configured to have its stored data erased when power is off and nonvolatile memory devices configured to retain its data even when power is off. Flash memory of the nonvolatile memory devices has been widely used for computers, memory cards, etc. because it is capable of batch-erasing data of a cell electrically.

The flash memory devices may be classified into NOR-type flash memory and NAND-type flash memory based on a coupling state between a cell and a bit line. The NOR-type flash memory is configured to have two or more cell transistors coupled in parallel to one bit line, to store data using a channel hot electron method, and to erase data using a Fowler-Nordheim (F-N) tunneling method. The NAND-type flash memory is configured to have two or more cell transistors coupled in series to one bit line and to store or erase data using the F-N tunneling method. In general, the NOR-type flash memory is not as suitable as NAND-type flash memory for high integration due to its high current consumption, but has a benefit in that it is suitable for high speed operations. The NAND-type flash memory is comparatively more suitable for high integration since it uses less current than the NOR-type flash memory.

Conventional nonvolatile memory device may include a memory cell array configured to store data, page buffers coupled to bit lines of the memory cell array, a Y decoder configured to supply the page buffers with a data IO path, an X decoder configured to couple the word lines of the memory cell array with a global word line for supplying a voltage, a voltage supply unit configured to generate voltages and supply them to the global word line, and a control unit configured to control an overall operation.

FIG. 1 is a circuit diagram of a conventional page buffer.

Referring to FIG. 1, the page buffer 100 includes a sensing unit 110, a precharge unit 120, a data transmission unit 130, a data latch unit 140, and a data change unit 150.

The sensing unit 110 is coupled with a bit line and is configured to sense a bit line voltage and change a voltage level of a sense node SO. The precharge unit 120 is configured to precharge the sense node SO.

The data transmission unit 130 is configured to transfer data, stored in the data latch unit 140, to the sense node SO and to provide a data transmission path for transferring data to be latched by latches of the data latch unit 140.

The data latch unit 140 includes first and second latches L1, L2. Each of the latches is configured to latch data for a program or to read data stored in a memory cell and store the read data. The data change unit 150 is configured to input data to the first and second latches L1, L2 in response to a voltage level of the sense node SO.

The sensing unit 110 includes a first NMOS transistor N1. The precharge unit 120 includes a first PMOS transistor P1. The data transmission unit 130 includes second to fifth NMOS transistors N2 to N5. The data latch unit 140 includes first to fourth inverters I1 to I4. The data change unit 150 includes sixth to ninth NMOS transistors N6 to N9.

The second and third NMOS transistors N2 and N3 operate to transmit data of the first latch L1, and the fourth and fifth NMOS transistors N4, N5 operate to transmit data of the second latch L2.

The first and second inverters I1, I2 form the first latch L1, and the third and fourth inverters I3, I4 form the second latch L2. Furthermore, the sixth and seventh NMOS transistors N6, N7 operate to transfer data to or from the first latch L1, and the eighth and ninth NMOS transistors N8, N9 operate to transfer data to or from the second latch L2.

In the page buffer circuit described above, when the number of data bits stored in a memory cell increases, the number of latches is increased. Here, in the data transmission unit 130 and the data change unit 150, with an increase in the number of latches, the number of transistors for transferring data to or from each latch is also increased. Such an increase of the transistors for data transfer corresponding to the increase of the latches causes an increase in the overall size of a page buffer.

In particular, consistent with the recent development of a multi-level cell (MLC) capable of storing a greater amount of bit information, the number of latches in a page buffer and thus the number of accompanying transistors is inevitably increased. Such an increase in the number of elements is a concern in light of efforts to reduce the overall size of a memory device.

BRIEF SUMMARY

Exemplary embodiments relate to a page buffer circuit which is capable of minimizing/reducing an increase in the number of data transmission transistors accompanying latches of a page buffer circuit despite an increase in the number of latches.

A page buffer circuit according to an exemplary aspect of this disclosure comprises a first sensing unit configured to sense a voltage of a bit line and change a voltage of a first sense node, a data conversion unit configured to sense a voltage level of the first sense node and change a voltage level of a second sense node or to couple the second sense node and the first sense node, and first and second latch units coupled in common to the second sense node.

The data conversion unit comprises a second sensing unit configured to sense a voltage level of the first sense node and change a voltage level of the second sense node, and a transmission unit configured to couple the second sense node and the first sense node.

The second sensing unit is configured to couple the second sense node with a ground node in response to a voltage level of the first sense node and a data input control signal.

Each of the first and second latch units comprises a latch circuit coupled between first and second nodes, a first switching element coupled between the first node and the second sense node, and a second switching element coupled between the second node and the second sense node.

The transmission unit is configured to couple the second sense node and the first sense node in response to a data output control signal.

The second sensing unit is configured to couple the second sense node with an input node of a power supply voltage in response to a voltage level of the first sense node and a data input control signal.

One or more of the first and second latch units are coupled to a data input unit configured to receive data for a program in response to a data input signal.

A page buffer circuit according to another aspect of this disclosure comprises a first sensing unit configured to sense a voltage of a bit line and change a voltage of a first sense node, a data conversion unit configured to sense a voltage level of the first sense node and change a voltage level of a second sense node or to couple the second sense node and the first sense node, and an N number of latch units coupled in common to the second sense node, wherein N is a natural number greater than two.

The data conversion unit comprises a second sensing unit configured to sense a voltage level of the first sense node and change a voltage level of the second sense node, and a transmission unit configured to couple the second sense node and the first sense node.

The second sensing unit is configured to couple the second sense node with a ground node in response to a voltage level of the first sense node and a data input control signal.

The second sensing unit is configured to couple the second sense node with an input node of a power supply voltage in response to a voltage level of the first sense node and a data input control signal.

One or more of the N number of the latch units are coupled to a data input unit configured to receive data for a program in response to a data input signal.

The transmission unit is configured to couple the second sense node and the first sense node in response to a data output control signal.

Each of the N number of latch units comprises a latch circuit coupled between first and second nodes, a first switching element coupled between the first node and the second sense node, and a second switching element coupled between the second node and the second sense node.

DESCRIPTION OF EMBODIMENTS

Hereinafter, exemplary embodiments of the present disclosure will be described in detail with reference to the accompanying drawings. The figures are provided to enable one of ordinary skill in the art to make and use the exemplary embodiments of the disclosure.

Figure 1:
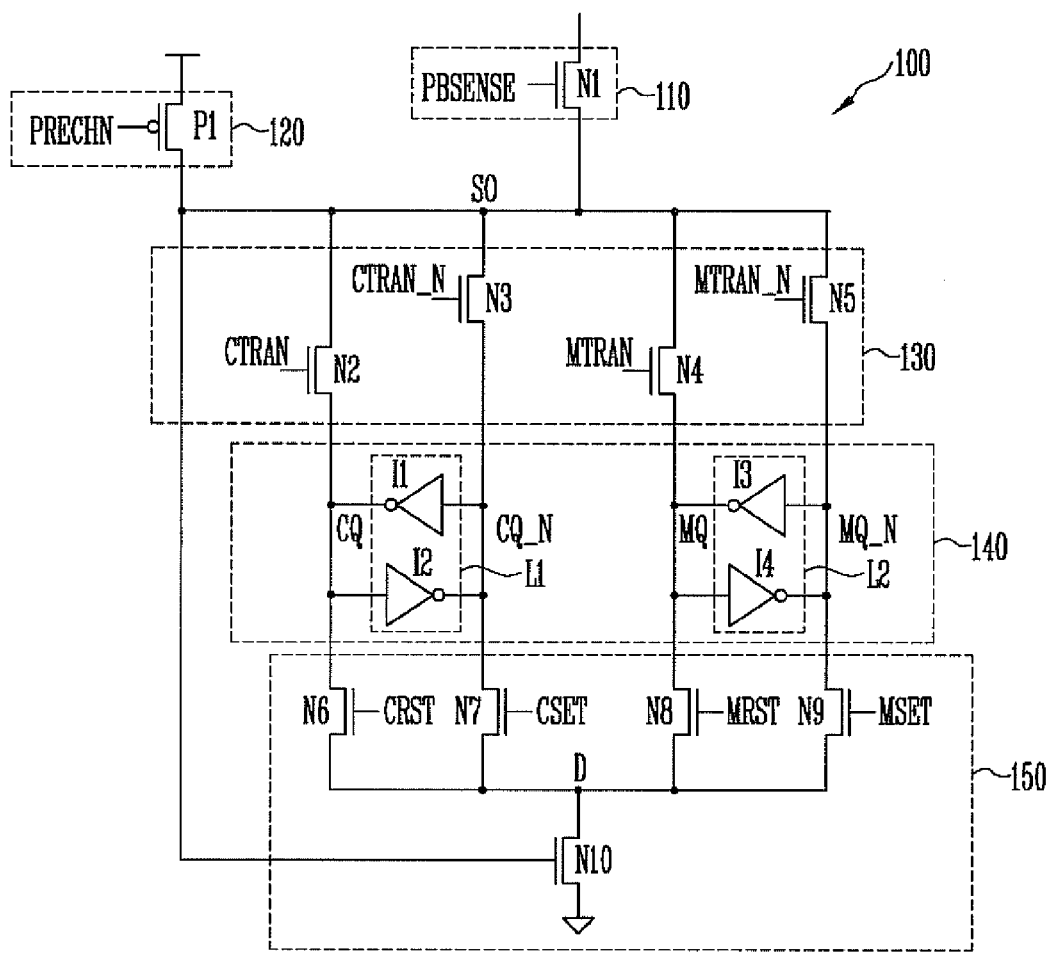
FIG. 1 is a circuit diagram of a conventional page buffer.
Figure 2A:
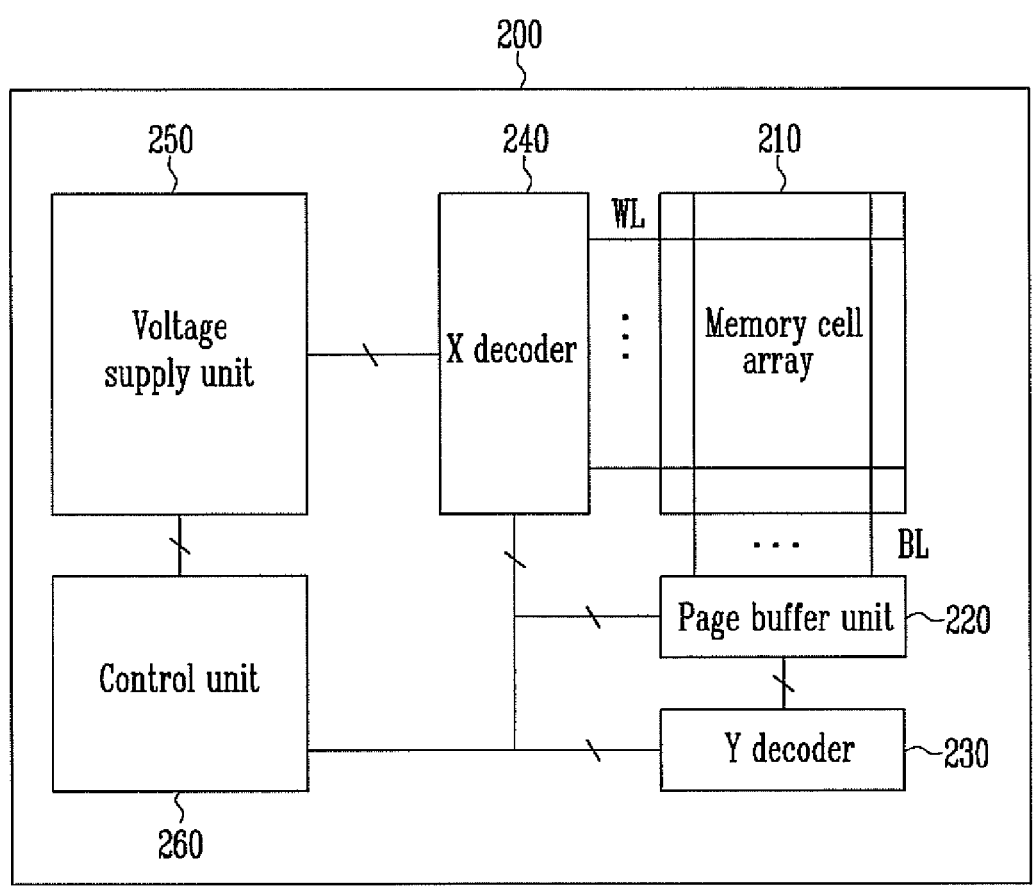
FIG. 2A is a block diagram of a nonvolatile memory device according to an embodiment of this disclosure.

FIG. 2A is a block diagram of a nonvolatile memory device according to an embodiment of this disclosure.

Referring to FIG. 2A, the nonvolatile memory device 200 includes a memory cell array 210, a page buffer unit 220, a Y decoder 230, an X decoder 240, a voltage supply unit 250, and a control unit 260.

The memory cell array 210 includes memory cells for storing data. The memory cells of the memory cell array 210 are selected by bit lines BL and word lines WL. The bit lines are coupled with page buffers of the page buffer unit 220, and the word lines are coupled with a global word line for supplying voltages via the X decoder 240.

The page buffer unit 220 includes a plurality of the page buffers. Each of the page buffers is coupled with one or more bit lines. The page buffer is configured to latch program data and transfer the program data to the bit line or to read data, stored in the memory cell, through the bit line and latch the read data.

The Y decoder 230 is configured to provide a data IO path to the page buffers of the page buffer unit 220. The X decoder 240 is configured to couple a selected word line WL and the global word line.

The voltage supply unit 250 is configured to generate operating voltages applied to the global word line. The control unit 260 is configured to control program, read, and erase operations for data by controlling the page buffer unit 220, the Y decoder 230, the X decoder 240, and the voltage supply unit 250.

Figure 2B:
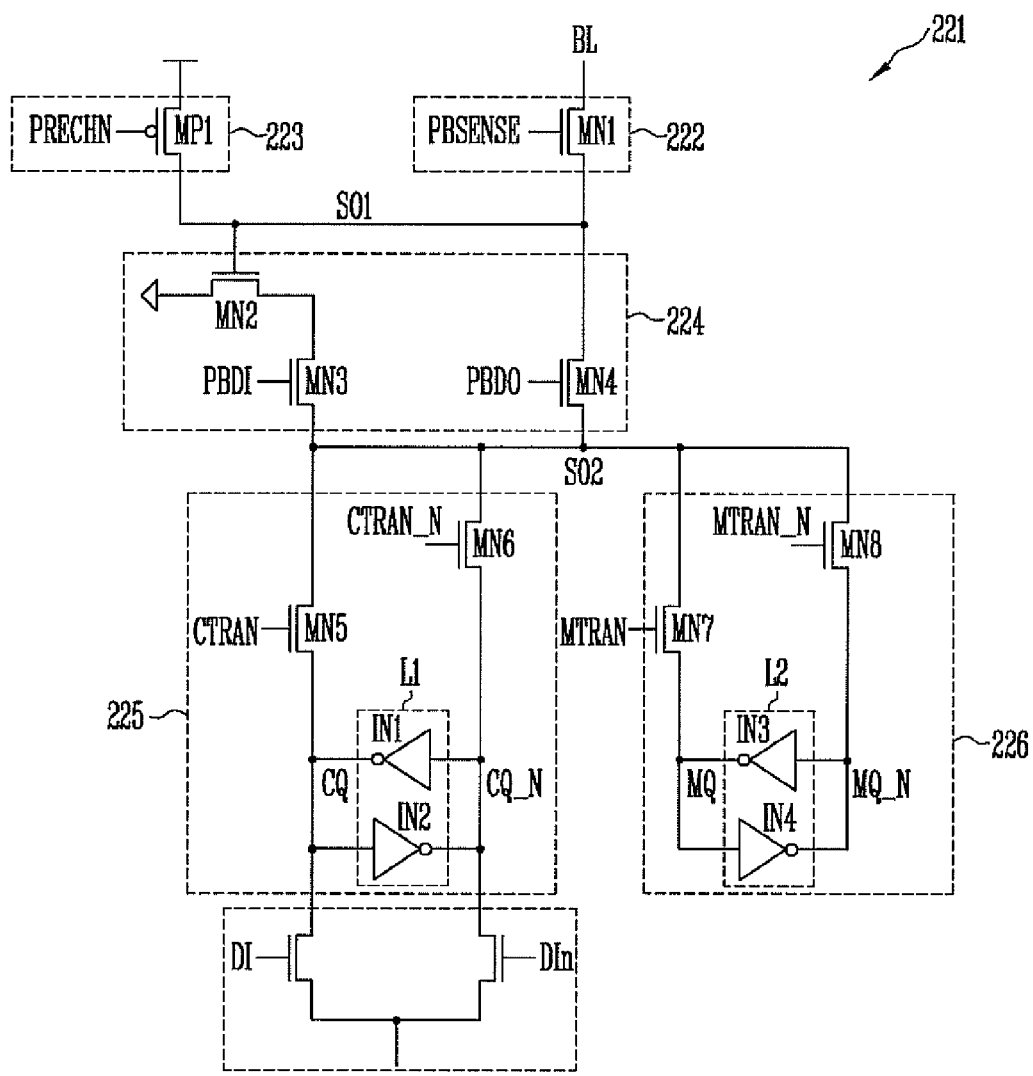
FIG. 2B is a circuit diagram of a first embodiment of the page buffer shown in FIG. 2A according to a first embodiment.

FIG. 2B is a circuit diagram of the page buffer 221 in FIG. 2A according to a first embodiment.

Referring to FIG. 2B, a page buffer 221 (i.e., one of the page buffers included in the page buffer unit 220) includes a first sensing unit 222, a precharge unit 223, a data conversion unit 224, a first latch unit 225, and a second latch unit 226. For purposes of illustration, only one unit configured to input and output data to and from the latch circuit of the first latch unit 225 in response to data input and output signals DI, DIn is shown. However, additional units to input and output data to and from the latch circuits of the page buffer 221 may also be present. Further, circuits corresponding to a component for program verification, a component for selecting a bit line, etc. are omitted from the illustration because their construction is apparent to those of ordinary skill in the art.

The first sensing unit 222 is coupled with the bit line BL and is configured to sense a bit line voltage of the bit line BL and change a voltage of a first sense node SO1 in response to the sensed result. The precharge unit 223 is configured to precharge the first sense node SO1.

The data conversion unit 224 includes a sensing component (for example, MN2 and MN3) and a transmission component (for example, MN4). The sensing component is configured to sense a voltage level of the first sense node SO1 and change a voltage level of a second sense node SO2 accordingly. The transmission component is configured to couple the second sense node SO2 and the first sense node SO1 and transfer a voltage level of the second sense node SO2 to the first sense node SO1.

The first and second latch units 225, 226 are commonly coupled with the second sense node SO2 and are configured to latch data in response to the operation of the data conversion unit 224 or transfer latched data.

The first and second latch units 225, 226 each include a latch circuit (for example, latch L1) and a latch selection circuit (for example, a latch selection circuit formed by transistors MN5-MN6). The latch selection circuit is configured to select a node of the latch circuit and couple the selected node with the second sense node SO2.

The first sensing unit 222 includes a first NMOS transistor MN1, and the precharge unit 223 includes a first PMOS transistor MP1. The data conversion unit 224 includes second and third NMOS transistors MN2, MN3, constituting the sensing component, and a fourth NMOS transistor MN4 constituting the transmission component.

The first and second latch units 225, 226 include fifth to eighth NMOS transistors MN5 to MN8 and first to fourth inverters IN1 to IN4.

The first NMOS transistor MN1 is coupled between the bit line BL and the first sense node SO1, and the first PMOS transistor MP1 is coupled between a power supply voltage and the first sense node SO1. A sense control signal PBSENSE is inputted to the gate of the first NMOS transistor MN1, and a precharge control signal PRECHN is inputted to the gate of the first PMOS transistor MP1.

The second and third NMOS transistors MN2, MN3 are coupled in series between the second sense node SO2 and a ground node. The gate of the second NMOS transistor MN2 is coupled with the first sense node SO1. A data input control signal PBDI is inputted to the gate of the third NMOS transistor MN3.

The fourth NMOS transistor MN4 is coupled between the first sense node SO1 and the second sense node SO2. A data output control signal PBDO is inputted to the gate of the fourth NMOS transistor MN4.

The fifth NMOS transistor MN5 is coupled between the second sense node SO2 and node CQ, and the sixth NMOS transistor MN6 is coupled between the second sense node SO2 and node CQ_N. A first data transmission signal CTRAN is inputted to the gate of the fifth NMOS transistor MN5, and a second data transmission signal CTRAN_N is inputted to the gate of the sixth NMOS transistor MN6.

The seventh NMOS transistor MN7 is coupled between the second sense node SO2 and node MQ, and the eighth NMOS transistor MN8 is coupled between the second sense node SO2 and node MQ_N. A third data transmission signal MTRAN is inputted to the gate of the seventh NMOS transistor MN7, and a fourth data transmission signal MTRAN_N is inputted to the gate of the eighth NMOS transistor MN8.

The first and second inverters IN1, IN2 are coupled together to form a first latch L1 between the node CQ and the node CQ_N, and the third and fourth inverters IN3, IN4 are coupled together to form a second latch L2 between the node MQ and the node MQ_N.

The data conversion unit 224 of the page buffer 221 is commonly used for all latches (for example, latches L1-L2). The operation of the page buffer 221 having the above structure is described below.

In describing an operation for changing/setting data at the first latch L1 and the second latch L2, a process for changing data of the node MQ_N is first described.

In applying data '1' to the node MQ_N, the precharge control signal PRECHN of a low level is applied to turn on the first PMOS transistor MP1. When the first PMOS transistor MP1 is turned on, the first sense node SO1 is precharged to a high level.

Next, the data input control signal PBDI of a high level voltage is applied to the third NMOS transistor MN3 to turn on the third NMOS transistor MN3. When the first sense node SO1 has a high level voltage at the same time that the third NMOS transistor MN3 is turned on, the second NMOS transistor MN2 is also turned on.

Thus, the second sense node SO2 is coupled with the ground node to thus obtain a low level voltage. In this case, to set data '1' at the node MQ_N, the third data transmission signal MTRAN of a high level voltage is applied, and the first, second, and fourth data transmission signals CTRAN, CTRAN_N, and MTRAN_N of a low level voltage are applied. When the third data transmission signal MTRAN is in a high level voltage, the seventh NMOS transistor MN7 is turned on so that the node MQ is coupled with the second sense node SO2. At this time, since the second sense node SO2 has a low level voltage, the voltage of the node MQ also becomes a low level voltage, and data '1' (i.e., data that corresponds to a high level voltage) is inputted to the node MQ_N and is latched.

Meanwhile, to input data '0' to the node MQ_N, in the state at which the second sense node SO2 has a low level voltage, the fourth data transmission signal MTRAN_N of a high level voltage is applied and the first to third data transmission signals CTRAN, CTRAN_N, and MTRAN of a low level voltage are applied, thereby turning on the eighth NMOS transistor MN8 only. Through the above method, data may be input to the node MQ or the node MQ_N of the second latch L1. By applying the same method to the first latch circuit 225, data may also be input to the node CQ or the node CQ_N of the first latch L1.

As to data transmission by the page buffer 221, there are two different transmission processes. The first process is to transmit data, latched in the first latch unit 225, to the bit line BL through the first sense node SO1. The second process is to transmit data between the first latch L1 and the second latch L2.

The first process of transmitting data, latched in the second latch unit 226, to the bit line BL through the first sense node SO1 is described below. For example, in the case where data of the node MQ_N of the second latch L2 is transmitted to the bit line BL, the fourth data transmission signal MTRAN_N of a high level voltage and the first to third data transmission signals CTRAN, CTRAN_N, and MTRAN of a low level voltage are applied. Next, the data output control signal PBDO of a high level voltage is applied.

When the fourth data transmission signal MTRAN_N of a high level voltage is applied, the eighth NMOS transistor MN8 is turned on. With the eight NMOS transistor MN8 turned on, when the data output control signal PBDO of a high level voltage is applied, the fourth NMOS transistor MN4 is turned on.

When the fourth and eighth NMOS transistors MN4, MN8 are thus turned on, the node MQ_N is coupled with the first sense node SO1. Further, while the node MQ-N is coupled with the first sense node SO1, when the sense control signal PBSENSE of a high level voltage is applied, the first NMOS transistor MN1 is turned on so that data latched in the node MQ_N are transferred to the bit line BL.

The following table shows the control signals applied in order to transmit data of the nodes CQ, CQ_N, MQ, and MQ_N to the bit line.

| | Control signal | | | | | |
| --- | --- | --- | --- | --- | --- | --- |
| | DATA CHANGE UNIT | | DATA TRANSMISSION UNIT | | | |
| Node | PBDO | PBDI | CTRAN | CTRAN_N | MTRAN | MTRAN_N |
| CQ | 1 | 0 | 1 | 0 | 0 | 0 |
| CQ_N | | 0 | 0 | 1 | 0 | 0 |

-continued

| | Control signal | | | | | |
|---|---|---|---|---|---|---|
| | DATA CHANGE UNIT | | DATA TRANSMISSION UNIT | | | |
| Node | PBDO | PBDI | CTRAN | CTRAN_N | MTRAN | MTRAN_N |
| MQ | | | 0 | 0 | 1 | 0 |
| MQ_N | | | 0 | 0 | 0 | 1 |

When the data of the first latch unit 225 are transferred to the bit line BL, the sense control signal PBSENSE of a high level voltage is applied to the first NMOS transistor MN1.

Meanwhile, the second process for transferring data of the node MQ to the node CQ is described below.

Prior to the transfer of data of the node MQ to the node CQ, a process of resetting the data of the node CQ to '0' is performed. In the process of resetting the node CQ, the precharge control signal PRECHN of a low level voltage is first applied to turn on the first PMOS transistor MP1. When the first PMOS transistor MP1 is turned on, the first sense node SO1 is precharged with a high level voltage.

When the first sense node SO1 becomes a high level, the second NMOS transistor MN2 is turned on. Next, the data input control signal PBDI of a high level voltage is applied to turn on the third NMOS transistor MN3. When the second and third NMOS transistors MN2, MN3 are turned on, the second sense node SO2 is coupled with the ground node.

Next, the first data transmission signal CTRAN of a high level voltage is applied to turn on the fifth NMOS transistor MN5 so that data of the node CQ is reset to '0'.

When data of the node CQ is reset to '0', data '0' is stored at the node CQ by the latch L1. Then, to transfer data of the node MQ to the first sense node SO1, the data output control signal PBDO of a high level voltage is applied to turn on the fourth NMOS transistor MN4. Next, the third data transmission signal MTRAN of a high level voltage is applied to turn on the seventh NMOS transistor MN7. Here, the first, second, and fourth data transmission signals CTRAN, CTRAN_N, and MTRAN_N, and the data input control signal PBDI of a low level voltage are applied.

When the fourth and seventh NMOS transistors MN4, MN7 are turned on, a voltage level of the first sense node SO1 is changed according to a data state of the node MQ. That is, when the node MQ has a high level voltage, the first sense node SO1 has a high level voltage and when the node MQ has a low level voltage, the first sense node SO1 has a low level voltage.

As described above, after a voltage level of the first sense node SO1 is changed according to a voltage level of the node MQ, the data output control signal PBDO is changed into a low level voltage, and the data input control signal PBDI is changed into a high level voltage. Next, the second data transmission signal CTRAN_N of a high level voltage is applied, and the first, third, and fourth data transmission signals CTRAN, MTRAN, and MTRAN_N of a low level voltage are applied.

In the case where the node MQ has a high level voltage, the second NMOS transistor MN2 is turned on because the first sense node SO1 in turn has a high level voltage so that the third NMOS transistor MN3 is turned on in response to the data input control signal PBDI. Accordingly, the second sense node SO2 is coupled with the ground node and thus has a low level voltage. In this case, when the second data transmission signal CTRAN_N of a high level voltage is applied to turn on the sixth NMOS transistor MN6, the node CQ_N is coupled with the second sense node SO2, thus in turn has a low level voltage. Accordingly, data '1' (i.e., a high level) is inputted to the node CQ through the inverter IN1. Through the foregoing steps, the data of the node MQ is transferred to the node CQ.

Meanwhile, in the case where the node MQ has a low level voltage, the second NMOS transistor MN2 is turned off because the first sense node SO1 obtains a low level voltage through the fourth NMOS transistor MN4. Here, although the data input control signal PBDI of a high level voltage is applied to the third NMOS transistor MN3, the second sense node SO2 is in a floating state. Accordingly, although the second data transmission signal CTRAN_N of a high level voltage is applied to turn on the sixth NMOS transistor MN6, the second sense node SO2 does not change an existing voltage of the node CQ_N. Thus, the node CQ maintains the initial low level (i.e., data '0'). By the foregoing steps, the data of the node MQ is transferred to the node CQ.

With the second to fourth NMOS transistors MN2 to MN4, the data conversion unit 224 can be commonly used to perform data transfer operations of the first and second latches L1, L2. The data conversion unit 224 can be used to commonly perform such data transfer operations for any number of latches despite an increase of the number of latches in the page buffer 221.

Figure 2C:
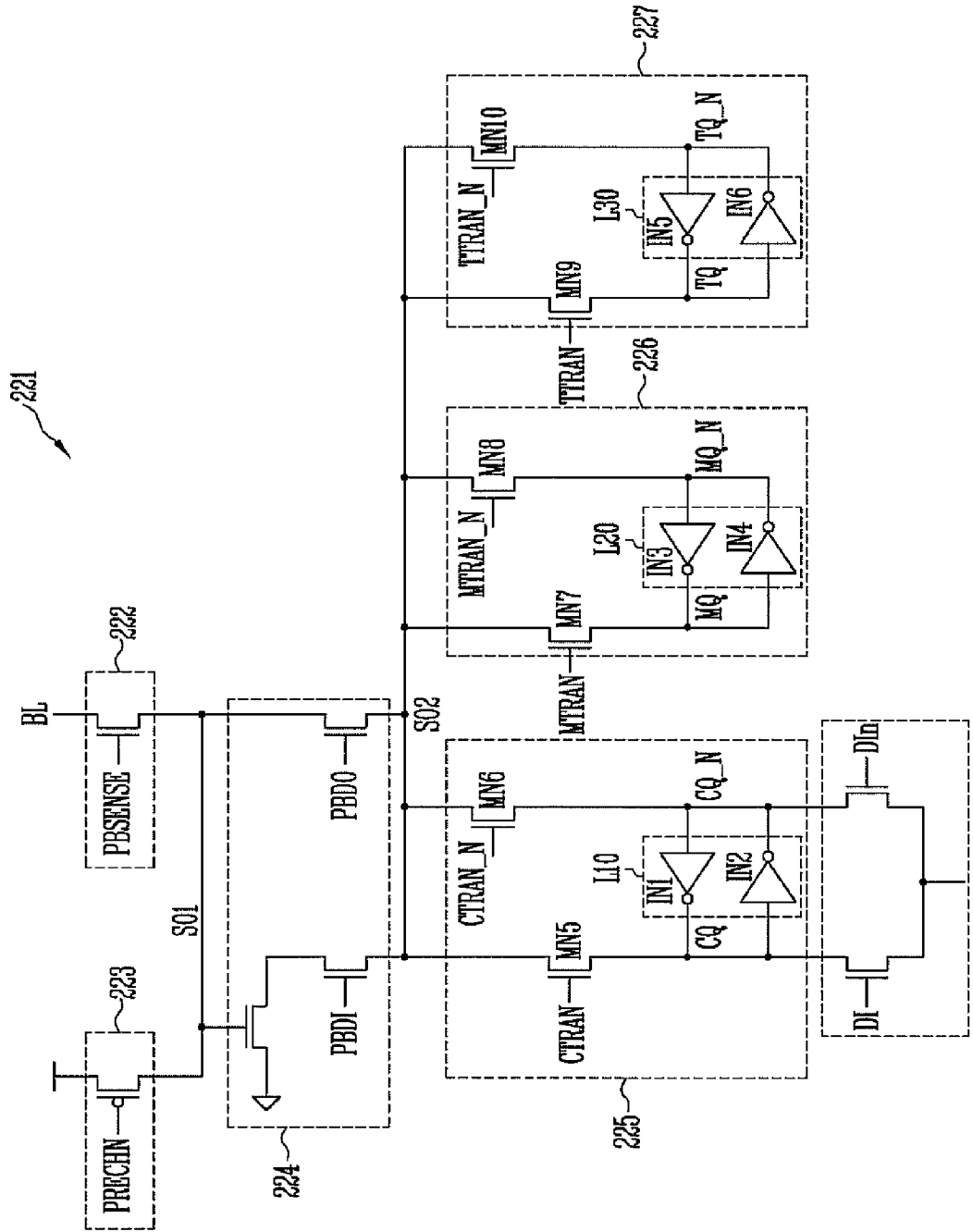
FIG. 2C is a circuit diagram of the page buffer shown in FIG. 2A according to a second embodiment.

FIG. 2C is a circuit diagram according to a second embodiment of the page buffer shown in FIG. 2A.

Referring to FIG. 2C, the page buffer 221 may further include a third latch unit 227 in addition to a first sensing unit 222, a precharge unit 223, a data conversion unit 224, and first and second latch units 225, 226 that are also used to form the page buffer 221 shown in FIG. 2B.

The third latch unit 227 includes ninth and tenth NMOS transistors MN9, MN10 and fifth and sixth inverters IN5, IN6. The first to third latch units 225-227 are coupled in common to a second sense node SO2.

Thus, with the third latch unit 227 being added, the two inverters constituting the latch L30 and the two transistors MN9 and MN10 coupling respective nodes of the latch with the second sense node SO2 are added.

Despite the addition of the third latch unit 227 and any other additional latches in the page buffer 221, where the addition occurs in the same manner that the third latch unit 227 is added, the data conversion unit 224 maintains the same construction. Accordingly, even though the number of latches in the page buffer 221 increases, the elements constituting the data conversion unit 224 does not increase. For example, the only additional circuitry in adding latches to the page buffer 221 may be the additional latches themselves.

While the foregoing description has been illustrated with FIG. 3 which shows only three latches, the same principle applies when the number of latches is more than three. Thus, in adding latches in excess of three shown in FIG. 3, only the number of inverters constituting each latch and the number of transistors (i.e., switching elements) for coupling the respective nodes of the latch with the second sense node SO2 are increased. Despite such an increase in the number of latches in the page buffer 221, the data conversion unit 224 may remain the same where the number of elements constituting the data conversion unit 224 does not increase. Accordingly, while the number of latches used in a page buffer may increase, the number of the overall elements in the page buffer can be significantly reduced as compared with conventional page buffers.

Meanwhile, a page buffer 221 according to the third embodiment can be constructed by replacing only the second NMOS transistor MN2 corresponding to the sense part of the data conversion unit 224 (refer to FIG. 2B) with a second PMOS transistor MP2.

Figure 2D:
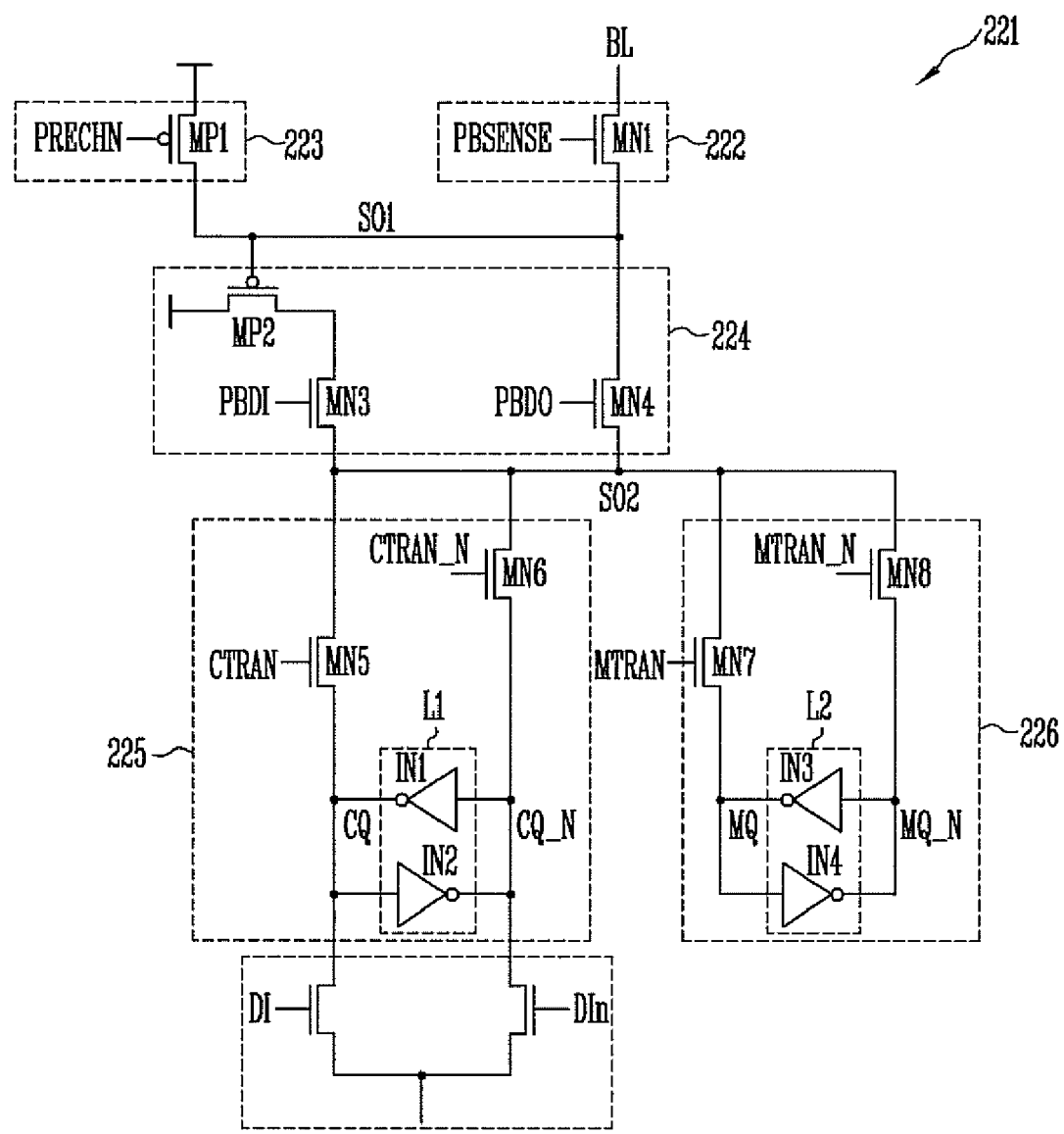
FIG. 2D is a circuit diagram of the page buffer shown in FIG. 2A according to a third embodiment.

FIG. 2D is a circuit diagram according to a third embodiment of the page buffer shown in FIG. 2A.

Referring to FIG. 2D, the sensing component of a data conversion unit 224 includes a second PMOS transistor MP2 and a third NMOS transistor MN3. The second PMOS transistor MP2 and the third NMOS transistor MN3 are coupled in series between a power supply voltage and a second sense node SO2. The second PMOS transistor MP2 is turned on according to a voltage level of a first sense node SO1.

While the third NMOS transistor MN3 is shown, the third NMOS transistor MN3 may alternatively be replaced with a PMOS transistor to prevent a voltage drop across the same transistor when the second PMOS transistor MP2 is turned on. If the third NMOS transistor MN3 is replaced with the PMOS transistor, a corresponding change in the data input control signal PBDI is to be made so that an inverse of the data input control signal PBDI is inputted to the gate of the PMOS transistor.

As described above, according to the present disclosure, the number of elements in a data transmission component of a page buffer can be minimized/reduced, where the number of elements remains the same despite an increase in the number of latches used in the page buffer. Accordingly, a page buffer circuit can be simplified and the overall circuit area can be reduced because the increased number of elements corresponding to an increase in the number of latches constituting a page buffer can be minimized/reduced.

What is claimed is:

1. A page buffer circuit, comprising:
    a first sensing unit configured to sense a voltage of a bit line and change a voltage of a first sense node;
    a data conversion unit configured to sense a voltage level of the first sense node and change a voltage level of a second sense node or to couple the second sense node and the first sense node; and
    first and second latch units coupled in common to the second sense node.

2. The page buffer circuit of claim 1, wherein the data conversion unit comprises:
    a second sensing unit configured to sense a voltage level of the first sense node and change a voltage level of the second sense node; and
    a transmission unit configured to couple the second sense node and the first sense node.

3. The page buffer circuit of claim 2, wherein the second sensing unit is configured to couple the second sense node with a ground node in response to a voltage level of the first sense node and a data input control signal.

4. The page buffer circuit of claim 2, wherein the transmission unit is configured to couple the second sense node and the first sense node in response to a data output control signal.

5. The page buffer circuit of claim 2, wherein the second sensing unit is configured to couple the second sense node with an input node of a power supply voltage in response to a voltage level of the first sense node and a data input control signal.

6. The page buffer circuit of claim 1, wherein each of the first and second latch units comprises:
    a latch circuit coupled between first and second nodes;
    a first switching element coupled between the first node and the second sense node; and
    a second switching element coupled between the second node and the second sense node.

7. The page buffer circuit of claim 1, wherein one or more of the first and second latch units are coupled to a data input unit configured to receive data for a program in response to a data input signal.

8. A page buffer circuit, comprising:
    a first sensing unit configured to sense a voltage of a bit line and change a voltage of a first sense node;
    a data conversion unit configured to sense a voltage level of the first sense node and change a voltage level of a second sense node or to couple the second sense node and the first sense node; and
    an N number of latch units coupled in common to the second sense node, wherein N is a natural number greater than two.

9. The page buffer circuit of claim 8, wherein the data conversion unit comprises:
    a second sensing unit configured to sense a voltage level of the first sense node and change a voltage level of the second sense node; and
    a transmission unit configured to couple the second sense node and the first sense node.

10. The page buffer circuit of claim 9, wherein the second sensing unit is configured to couple the second sense node with a ground node in response to a voltage level of the first sense node and a data input control signal.

11. The page buffer circuit of claim 9, wherein the second sensing unit is configured to couple the second sense node with an input node of a power supply voltage in response to a voltage level of the first sense node and a data input control signal.

12. The page buffer circuit of claim 9, wherein one or more of the N number of the latch units are coupled to a data input unit configured to receive data for a program in response to a data input signal.

13. The page buffer circuit of claim 9, wherein the transmission unit is configured to couple the second sense node and the first sense node in response to a data output control signal.

14. The page buffer circuit of claim 8, wherein each of the N number of latch units comprises:
    a latch circuit coupled between first and second nodes;
    a first switching element coupled between the first node and the second sense node; and
    a second switching element coupled between the second node and the second sense node.

* * * * *